(12) United States Patent
Bazes

(10) Patent No.: US 8,729,942 B2
(45) Date of Patent: *May 20, 2014

(54) RACE FREE SEMI-DYNAMIC D-TYPE FLIP FLOP

(71) Applicant: Marvell Israel (M.I.S.L) Ltd., Yokneam (IL)

(72) Inventor: Mel Bazes, Haifa (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 0 days.

This patent is subject to a terminal disclaimer.

(21) Appl. No.: 14/085,475

(22) Filed: Nov. 20, 2013

(65) Prior Publication Data

US 2014/0077853 A1    Mar. 20, 2014

Related U.S. Application Data

(63) Continuation of application No. 13/300,393, filed on Nov. 18, 2011, now Pat. No. 8,593,194.

(60) Provisional application No. 61/506,479, filed on Jul. 11, 2011, provisional application No. 61/441,598, filed on Feb. 10, 2011, provisional application No. 61/437,176, filed on Jan. 28, 2011, provisional application No. 61/418,365, filed on Nov. 30, 2010.

(51) Int. Cl.
*H03K 3/00* (2006.01)

(52) U.S. Cl.
USPC .............................. 327/218; 327/208; 326/95

(58) Field of Classification Search
CPC .......... H03K 3/0375; H03K 3/356173; H03K 3/012; H03K 3/356121; H03K 3/356191; G01R 31/318541; G11C 11/41

USPC ................. 327/199–203, 208–214, 218, 219, 327/223–225; 326/93–95

See application file for complete search history.

(56) References Cited

U.S. PATENT DOCUMENTS

| | | | |
|---|---|---|---|
| 5,881,002 A | 3/1999 | Hamakawa | |
| 5,886,553 A | 3/1999 | Matsui | |
| 5,917,355 A * | 6/1999 | Klass | 327/208 |
| 6,222,404 B1 | 4/2001 | Mehta et al. | |
| 6,404,260 B1 | 6/2002 | Cruz-Albrecht | |
| 6,674,666 B2 | 1/2004 | Maone et al. | |
| 7,218,160 B2 * | 5/2007 | Wada et al. | 327/200 |
| 7,403,446 B1 | 7/2008 | Parameswaran et al. | |
| 7,688,640 B2 | 3/2010 | Kang | |
| 7,719,527 B2 | 5/2010 | Lu | |
| 7,994,823 B2 * | 8/2011 | Lee et al. | 326/96 |
| 2003/0226077 A1 | 12/2003 | Zyuban et al. | |
| 2005/0189977 A1 | 9/2005 | Chen | |
| 2012/0133408 A1 | 5/2012 | Bazes | |

OTHER PUBLICATIONS

U.S. Appl. No. 10/802,646, filed Aug. 24, 2011, Bazes, Mel.

(Continued)

*Primary Examiner* — Lincoln Donovan
*Assistant Examiner* — Thomas Skibinski

(57) ABSTRACT

Some of the embodiments of the present disclosure provide a D-type flip-flop, comprising a first latch configured to generate a sample enable signal, based on logical states of an input signal, and generate a sampled signal, based on logical states of the input signal and the sample enable signal; and a second latch configured to generate an output signal responsively to the sampled signal. Other embodiments are also described and claimed.

20 Claims, 7 Drawing Sheets

(56) References Cited

OTHER PUBLICATIONS

U.S. Appl. No. 12/963,420, filed on Dec. 8, 2010, Holzman, "Latching Signal Generator".

U.S. Appl. No. 13/216,863, filed Aug. 24, 2011, Bazes, "Complementary Semi-Dynamic D-Type Flip-Flop".

Klass, Fabian, "Semi-Dynamic and Dynamic Flip-Flops with Embedded Logic", IEEE, 1998 Symposium on VLSI Circuits Digest of Technical Papers, Jun. 1998, pp. 108-109.

* cited by examiner

US 8,729,942 B2

RACE FREE SEMI-DYNAMIC D-TYPE FLIP FLOP

CROSS REFERENCE TO RELATED APPLICATIONS

The present disclosure is a continuation of and claims priority to U.S. patent application Ser. No. 13/300,393, filed Nov. 18, 2011, now U.S. Pat. No. 8,593,194, issued Nov. 26, 2013, which claims priority to U.S. Provisional Patent Application No. 61/506,479, filed Jul. 11, 2011, and U.S. Provisional Patent Application No. 61/441,598, filed Feb. 10, 2011, and U.S. Provisional Patent Application No. 61/437,176, filed Jan. 28, 2011, and U.S. Provisional Patent Application No. 61/418,365, filed Nov. 30, 2010, which are incorporated herein by reference.

TECHNICAL FIELD

Embodiments of the present disclosure relate to flip-flops, and more specifically, to semi-dynamic D type flip-flops.

BACKGROUND

Unless otherwise indicated herein, the approaches described in this section are not prior art to the claims in the present disclosure and are not admitted to be prior art by inclusion in this section.

Flip-flops are widely used in modern day electronic circuits. A semi-dynamic flip-flop is a high-performance flip-flop that is used, for example, in critical data paths to improve timing margins. In a conventional semi-dynamic flip-flop, a sampling window of a relatively short duration opens upon a transition of a clock signal from low to high. The conventional semi-dynamic flip-flop has to complete sampling of a high value of an input D before the sampling window closes. So a race condition exists between a circuit that samples the input D and another circuit that closes the sampling window. Furthermore, as circuit components shrink in size with the advancement of technology, variability between various similar circuit components is increasing. This increased variability in conventional semi-dynamic flip-flops increases a probability that the inherent race condition will cause the input D to be sampled incorrectly, thereby causing a malfunction in the flip-flop.

SUMMARY

In various embodiments, the present disclosure provides a D type flip-flop, comprising a first latch configured to generate a sample enable signal, based on logical states of an input signal, and generate a sampled signal, based on logical states of the input signal and the sample enable signal; and a second latch configured to generate an output signal responsively to the sampled signal. In various embodiments, there is also provided a method comprising generating, at a first latch, a sample enable signal based on logical states of an input signal; outputting, from the first latch, a sampled signal based on logical states of the input signal and the sample enable signal; and generating, by a second latch, an output signal responsively to the sampled signal.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

DETAILED DESCRIPTION

Figure 1:
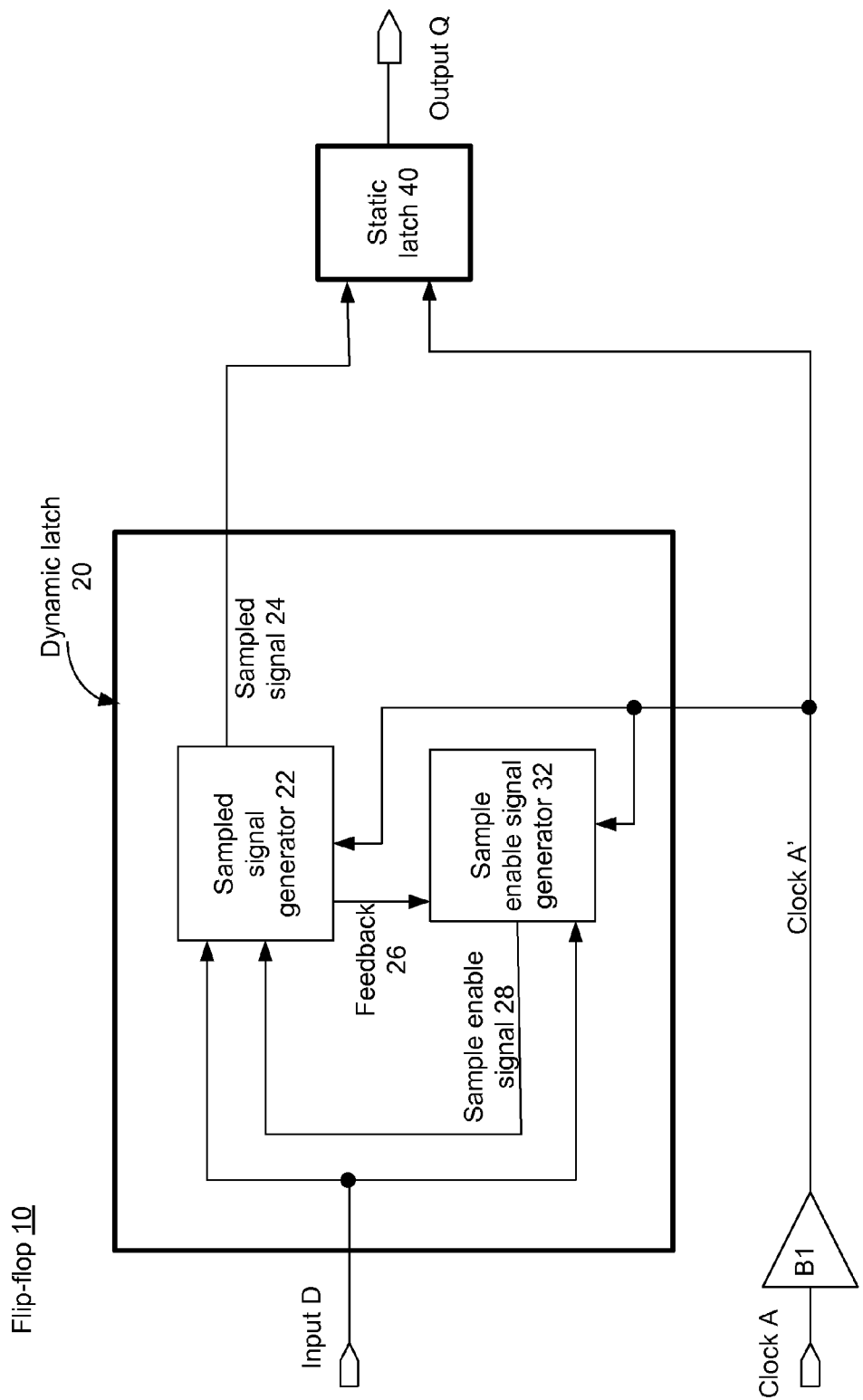
FIG. 1 schematically illustrates a flip-flop, in accordance with an embodiment of the present disclosure.

FIG. 1 schematically illustrates a flip-flop 10, in accordance with an embodiment of the present disclosure. The flip-flop 10 comprises a dynamic latch 20 and a static latch 40. In an embodiment, the flip-flop 10 receives an input signal D (also referred to herein as input D), and logically generates an output signal Q (also referred to herein as output Q).

In an embodiment, the dynamic latch 20 is configured to generate a sample enable signal 28 that is operative to selectively enable sampling the input D during a first logical condition, and to prevent sampling the input D during a second logical condition, where the sample enable signal 28 is generated responsively to the input D. The dynamic latch 20 is further configured to generate a sampled signal 24 by sampling the input D, responsively to the sample enable signal 28. The static latch 40 is configured to generate the output Q based on the sampled signal 24. As also will be discussed in more detail below, the flip-flop 10 of FIG. 1 does not exhibit any race condition. Unlike a conventional semi-dynamic D type flip-flop, because the input D prevents premature disabling of the enable signal 28, no inherent race condition is present in the flip-flop 10 between the sample enable signal 28 and the sampled signal 24.

In an embodiment, the flip-flop 10 receives a clock signal A (also referred to herein as clock A). The flip-flop 10 comprises a buffer B1 to buffer the clock A, and output a clock signal A' (also referred to herein as clock A'). Because of the buffering of the clock A by the buffer B1, a delay is present between the signals clock A and clock A'. In an embodiment, the buffer B1 is not present in the flip-flop 10.

In the example of FIG. 1, the dynamic latch 20 comprises a sampled signal generator 22 (also referred to herein as generator 22) configured to receive the input D, clock A' and the sample enable signal 28, and further configured to generate the sampled signal 24 and a feedback signal 26 (also referred to herein as feedback 26). The dynamic latch 20 further comprises a sample enable signal generator 32 configured to receive clock A', the input D and the feedback 26, and further configured to generate the sample enable signal 28. In an embodiment, the sampled signal 24 is dynamically pre-charged and conditionally discharged during an operation of the flip-flop 10, and accordingly, the sampled signal 24 is also referred to herein as an internal dynamic signal, as will be discussed in more detail herein later.

Figure 2:
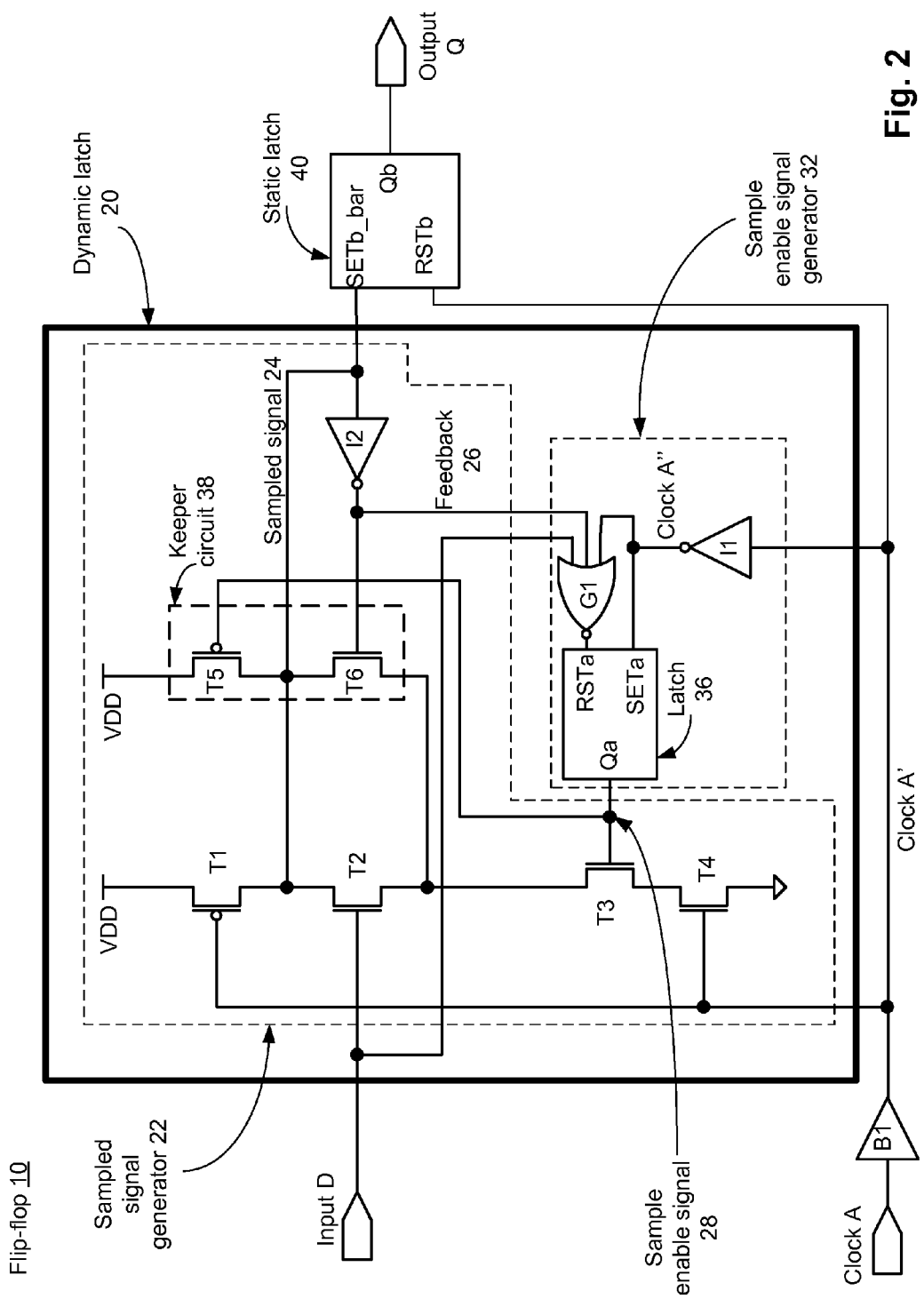
FIG. 2 schematically illustrates the flip-flop of FIG. 1 in more detail, in accordance with an embodiment of the present disclosure.

FIG. 2 schematically illustrates the flip-flop 10 of FIG. 1 in more detail, in accordance with an embodiment of the present disclosure. In FIG. 2, the generator 22 and the generator 32 are illustrated using dotted lines for purposes of illustrative clarity.

In an embodiment, the generator 22 includes transistors T1, T2, T3 and T4 that are connected in series. The transistor T1 is, for example, a P type transistor (e.g., a P type metal-oxide semiconductor field-effect transistor (MOSFET)), with a first terminal configured to receive a supply voltage $V_{DD}$, a second terminal coupled to a first terminal of the transistor T2, and a control terminal (e.g., a gate terminal) configured to receive the clock A'. The transistor T2 is, for example, an N type transistor (e.g., an N type MOSFET), with the first terminal coupled to the second terminal of the transistor T1, a second terminal coupled to a first terminal of the transistor T3, and a control terminal configured to receive the input D. The transistor T3 is, for example, an N type transistor, with the first terminal coupled to the second terminal of the transistor T2, a second terminal coupled to a first terminal of the transistor T4, and a control terminal configured to receive the sample enable signal 28. The transistor T4 is, for example, an N type transistor, with the first terminal coupled to the second terminal of the transistor T3, a second terminal coupled to a ground terminal, and a control terminal configured to receive the clock A'. A node coupled to the second terminal of the transistor T1 and the first terminal of the transistor T2 outputs the sampled signal 24, as illustrated in FIG. 2.

The generator 22 also includes a keeper circuit 38 comprising a keeper pull-up transistor T5 and a keeper pull-down transistor T6. The transistors T5 and T6 are coupled in series, as illustrated in FIG. 2. For example, the transistor T5 is coupled between a power supply terminal (e.g., that is supplying a supply voltage $V_{DD}$) and the first terminal of the transistor T2, and is controlled by the sample enable signal 28. The transistor T6 is coupled between the first terminal of the transistor T2 and the second terminal of the transistor T2 (i.e., coupled in parallel to the transistor T2), and is controlled by feedback 26. The generator 22 also includes an inverter I2, which receives the sampled signal 24 and inverts the sampled signal 24 to generate the feedback 26.

In an embodiment, the generator 32 includes an inverter I1, which receives the clock A' and inverts the clock A' to generate a clock signal A" (also referred to herein as clock A"). The generator 32 further includes a logical NOR gate G1, which, in an embodiment, is configured to receive the input D, the feedback 26 and the clock A".

The generator 32 also includes a latch 36, which includes a set terminal SETa, a reset terminal RSTa and an output terminal Qa. The output of the NOR gate G1 is input to the RSTa terminal, the clock A" is input to the SETa terminal, and the output terminal Qa outputs the sample enable signal 28.

In an embodiment, the enable signal generator 32 of the flip-flop 10 works with any asynchronous latch, e.g., a set dominant latch (SDL), a reset dominant latch (RDL), or any other appropriate latch (e.g., a simple latch). That is, the latch 36 of the enable signal generator 32 of the flip-flop 10 is a SDL, a RDL, or any other appropriate latch. In an embodiment, when the clock A (and consequently, the clock A') is low, the sample enable signal 28 is at the high logical value irrespective of the logical state of the output of the NOR gate G1. On the other hand, when the signal at the SETa terminal has a low logical value (e.g., when the clock A" is low, i.e., when the clock A' is high) and the signal at the RSTa terminal has a high logical value (i.e., the output of the NOR gate G1 has the high logical value), the latch 36 resets and the signal at the terminal Qa is low (i.e., the sample enable signal 28 has a low logical value). Also, when the signal at the SETa terminal and the signal at the RSTa terminal have low logical values (e.g., when the clock A" is low and the output of the NOR gate G1 is also low), the signal at the terminal Qa preserves its previous state.

The static latch 40 has an inverse of a set terminal (referred to herein as SETb_bar terminal), a reset terminal RSTb and an output terminal Qb. The sampled signal 24 is input to the SETb_bar terminal, the clock A' is input to the RSTb terminal, and the output terminal Qb outputs the output Q signal.

In an embodiment, the static latch 40 is a SDL. However, as discussed, the SETb_bar terminal acts as an inverse of a set terminal of an SDL. For example, for the latch 40, an inverse of a signal at the SETb_bar terminal dominates a signal at the RSTa terminal while determining the output. For example, when an inverse of the signal at the SETb terminal has a high logical value (i.e., when the sampled signal 24 is low), the SETb_bar terminal dominates and the signal at the terminal Qb is high (i.e., the output Q has a high logical value), irrespective of a logical state of the signal at the RSTb terminal. When the inverse of the signal at the SETb terminal has a low logical value (i.e., when the sampled signal 24 is high) and the signal at the RSTb terminal has a high logical value (i.e., the clock A' is high), the latch 40 resets and the signal at the terminal Qb is low (i.e., the output Q has a low logical value). When the inverse of the signal at the SETb terminal and the signal at the RSTb terminal have low logical values (i.e., when the sampled signal 24 is high and the clock A' is low), the signal at Qb preserves its previous state.

In an embodiment, the sample enable signal 28 is operative to enable the sample signal 24 to sample the input D while the input D is at the high logical value, and prevent the sample signal 24 from sampling the input D while the input D is at the low logical value. The sampled signal 24 is pre-charged to the high logical value during the low logical value of the clock A. The sampled signal 24 discharges to the low logical value during the high logical value of the clock A, based on the input D being sampled at the high logical value. The sampling of the input D is performed by discharging the sampled signal 24 if the input D is high in the vicinity of a rising edge of the clock A.

Figure 3:
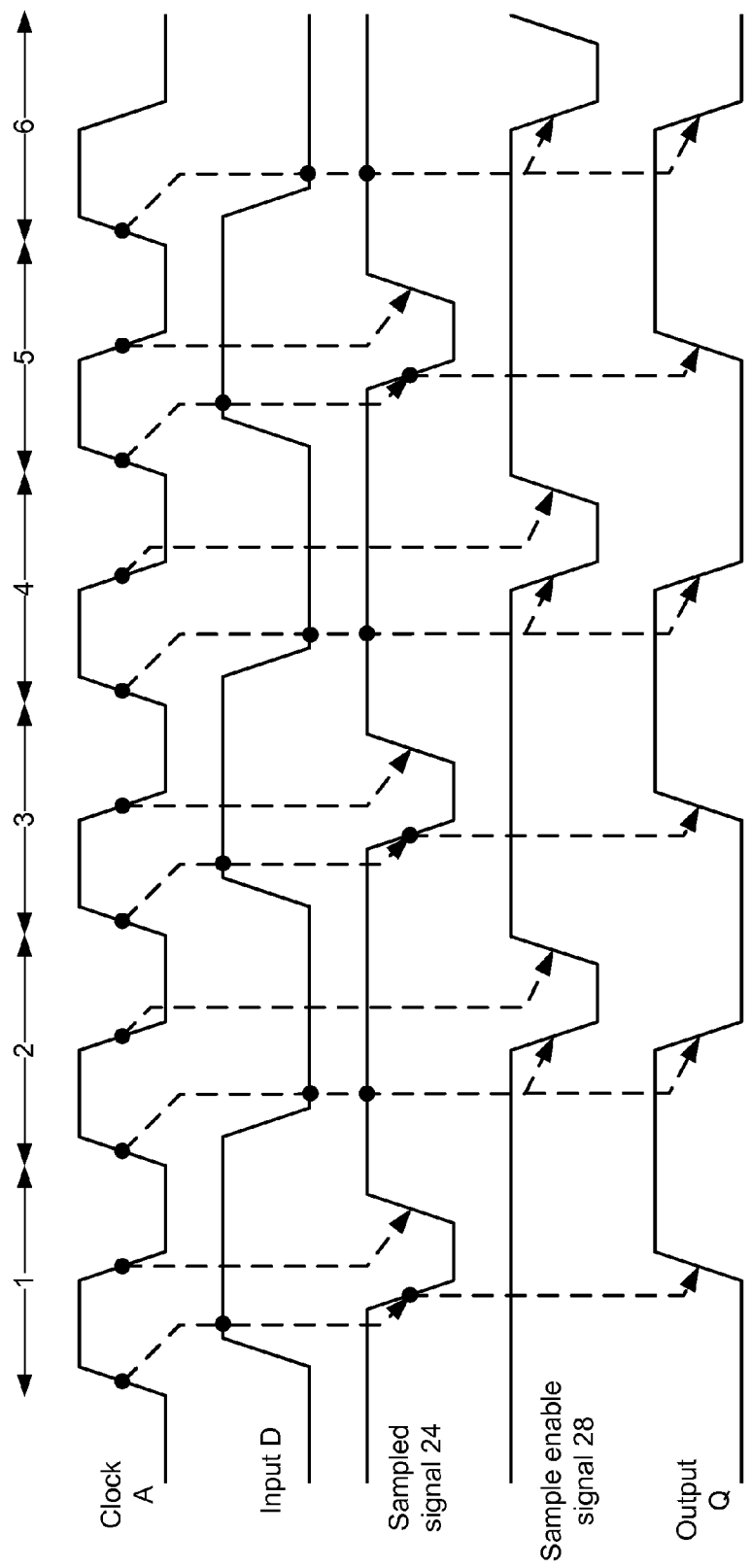
FIG. 3 illustrates a timing diagram of various signals of the flip-flop of FIGS. 1 and 2, in accordance with an embodiment of the present disclosure.

FIG. 3 illustrates a timing diagram of various signals of the flip-flop of FIGS. 1 and 2, in accordance with an embodiment of the present disclosure. For example, FIG. 3 illustrates timing diagram of the clock A, the input D, the sampled signal 24, the sample enable signal 28 and the output Q. Various clock cycles of the clock A are labeled in FIG. 3. For example, FIG. 3 illustrates six clock cycles of clock A.

Referring to FIG. 2, when the clock A (and the clock A', which follows the clock A) has a low logical value, the transistor T1 is turned on and the transistor T4 is turned off. Accordingly, when the clock A has the low logical value, the sampled signal 24 is pre-charged (e.g., by the supply voltage $V_{DD}$) and has a high logical value, as illustrated in FIG. 3. Also, during this time, as the clock A has the low logical value and consequently, the sampled signal 24 is pre-charged and has the high logical value, the output Q maintains its previous state during this time (as previously discussed in relation to the operation of the static latch 40).

When the clock A transitions to the high logical value, the flip-flop selectively samples the input D (e.g., based on the logical state of the input D). For example, during a rising edge of clock A (e.g., a rising edge of the clock cycle 1 of clock A), clock A' also transitions to a high logical value, which turns off the P type transistor T1 and turns on the N type transistor T4. Furthermore, the input D is at the high logical value in the vicinity (e.g., at or almost at the same time) of the rising edge of the clock cycle 1 of clock A, as illustrated in FIG. 3, which turns on the transistor T2. Also, as previously discussed, when the input D is at the high logical value (i.e., the output of the NOR gate G1 is at the low logical value) and the clock A is at the high logical value (i.e., clock A" is at the low logical value), the sample enable signal 28 maintains its previous state, where the previous state is the high logical value (as during the previous state, the clock A was at the low logical value, resulting in the high logical value of the sample enable signal 28). Due to the high logical value of the sample enable signal 28 while both the clock A and the input D are at the high logical values during the clock cycle 1 of the clock A, the N type transistor T3 is turned on (and the keeper pull-up transistor T5 is turned off). That is, while both the clock A and the input D are high during the clock cycle 1 of clock A, the transistors T1 and T5 are off and the transistors T2, T3 and T4 are on. Accordingly, the sampled signal 24 discharges, as illustrated in FIG. 3. Due to the discharging of the sampled signal 24, the keeper pull-down transistor T6 is turned on. Also, during this time, as the sampled signal 24 is at the low logical value, the static latch 40 outputs the output Q at the high logical value.

After the sampled signal 24 discharges, the flip-flop 10 halts sampling the input D until the next clock cycle. For example, although not illustrated in FIG. 3, if, for example, immediately after the sampled signal 24 discharges the input D were to go to a low logical value (e.g., thereby switching off the transistor T2), the sampled signal 24 would still have maintained the discharged state through the keeper pull-down transistor T6.

Thus, as discussed, if the input D is high when the clock A goes high, the RSTa terminal is disabled (i.e., becomes low) due to the high value of the input D. During this time, the sampled signal 24 discharges to the low logical value. In an embodiment, a discharge rate of the sampled signal 24 does not affect a functionality of the latch 36 as long as the input D is at the high logical value while the sampled signal 24 continues discharging to the low logical value. This is achieved by, for example, generating the sample enable signal 28 responsively to the input D. That is, as long as the input D is high, the RSTa terminal of the latch 36 will be disabled, thereby preventing a transition of the sample enable signal 28 to the low logical value before the sampled signal 24 has sufficiently discharged. Accordingly, no inherent race condition exists between the sample enable signal 28 and the sampled signal 24. For example, the sampled signal 24 does not have to discharge at a sufficiently fast rate for a proper operation of the flip-flop 10, and there is no possibility of the sample enable signal 28 starting to discharge before completion of the discharge of the sampled signal 24. Thus, unlike a conventional semi-dynamic flip-flop, a race condition does not exist in the flip-flop 10. In contrast, a conventional semi-dynamic flip-flop exhibits an inherent race condition between the sampled signal and the sample enable signal, which may make operation of such conventional semi-dynamic flip-flop unreliable.

After the sampled signal 24 sufficiently discharges, the RSTa terminal is disabled due to the low logical value of the sampled signal 24, and the input D is allowed to go to the low logical value (e.g., the keeper pull-down transistor T6 then maintains the discharged state of the sampled signal 24).

When the clock A goes low during the clock cycle 1, the transistor T1 is switched on and the transistor T4 is switched off. As a result, the sampled signal 24 is again pre-charged to the high logical value using the power supply voltage $V_{DD}$. During this time, the output Q maintains its previous state (i.e., the output Q maintains its high logical value state) and the sample enable signal 28 is at the high logical value (as the clock A is low), as illustrated in FIG. 3.

In the vicinity of the rising edge of the clock A during the clock cycle 2, the input D is at the low logical value. During this time, the input D, the feedback 26 and the clock A" are all at the low logical values, thereby resulting in a high logical value at the output of the NOR gate G1. Thus, during this time, the reset terminal RSTa is activated (while the SETa terminal has the low clock A" signal), thereby resetting the latch 36 and generating a low logical value for the sample enable signal 28, as illustrated in FIG. 3.

The transistor T1 switches off while the clock A transitions to the high logical value during the clock cycle 2. However, the low logical value of the sample enable signal 28 turns on the keeper pull-up transistor T5, thereby maintaining the pre-charged level of the sampled signal 24. Thus, the sample enable signal 28 prevents the sampled signal 24 from sampling the input D (e.g., by preventing the sampled signal 24 from discharging) if the input D is at the low logical value in the vicinity of the rising edge of the clock A during the clock cycle 2. As the pre-charged level of the sampled signal 24 is maintained while the clock A transitions to the high logical value during the clock cycle 2, the RSTb terminal of the static latch 40 is activated, resulting in a low logical value of the output Q, as illustrated in FIG. 3.

The sample enable signal 28 remains in the low logical value until the clock A transitions to the low logical value in the clock cycle 2, during which the SETa terminal is activated, the RSTa terminal is deactivated (as clock A" transitions to the high logical value) and the sample enable signal 28 is pulled up to the high logical value, as illustrated in FIG. 3. During this time (i.e., after the clock A transitions to the low logical value in the clock cycle 2), the transistor T1 is turned on and the transistor T4 is turned off, thereby maintaining the pre-charged level of the sampled signal 24. As the sampled signal 24 is pre-charged and the clock A' is low, the Qb terminal of the static latch 40 maintains its previous state (i.e., output Q continues to be at the low logical value), as illustrated in FIG. 3.

Referring again to the timing diagram of FIG. 3, the output Q takes on the state of the input D depending on the value of the input D in the vicinity of a rising edge of clock A, which is similar to the behavior of a D type flip-flop. Thus, the flip-flop 10 is a D-type flip-flop. Also, a logic value of the sampled signal 24 is at least in part based on a charge level of the sampled signal 24. For example, when the clock A is at the low logical value, the sampled signal 24 is pre-charged to the high logical value. When the clock A transitions to the high logical value, the sampled signal 24 selectively discharges based on a logical state of the input D. For example, when the clock A transitions to the high logical value, the sampled signal 24 discharges if the input D is at the high logical value in the vicinity of the rising edge of the clock A. On the other hand, when the clock A transitions to the high logical value, the sampled signal 24 does not discharge (i.e., remains pre-charged) if the input D is at the low logical value in the vicinity of the rising edge of the clock A. In an embodiment, the sampled signal 24 is a dynamic signal, and accordingly, the latch 20 is a dynamic latch. On the other hand, as one or more signals in the latch 40 do not depend on a charge level of one or more other signals, the latch 40 is a static latch.

Figure 4:
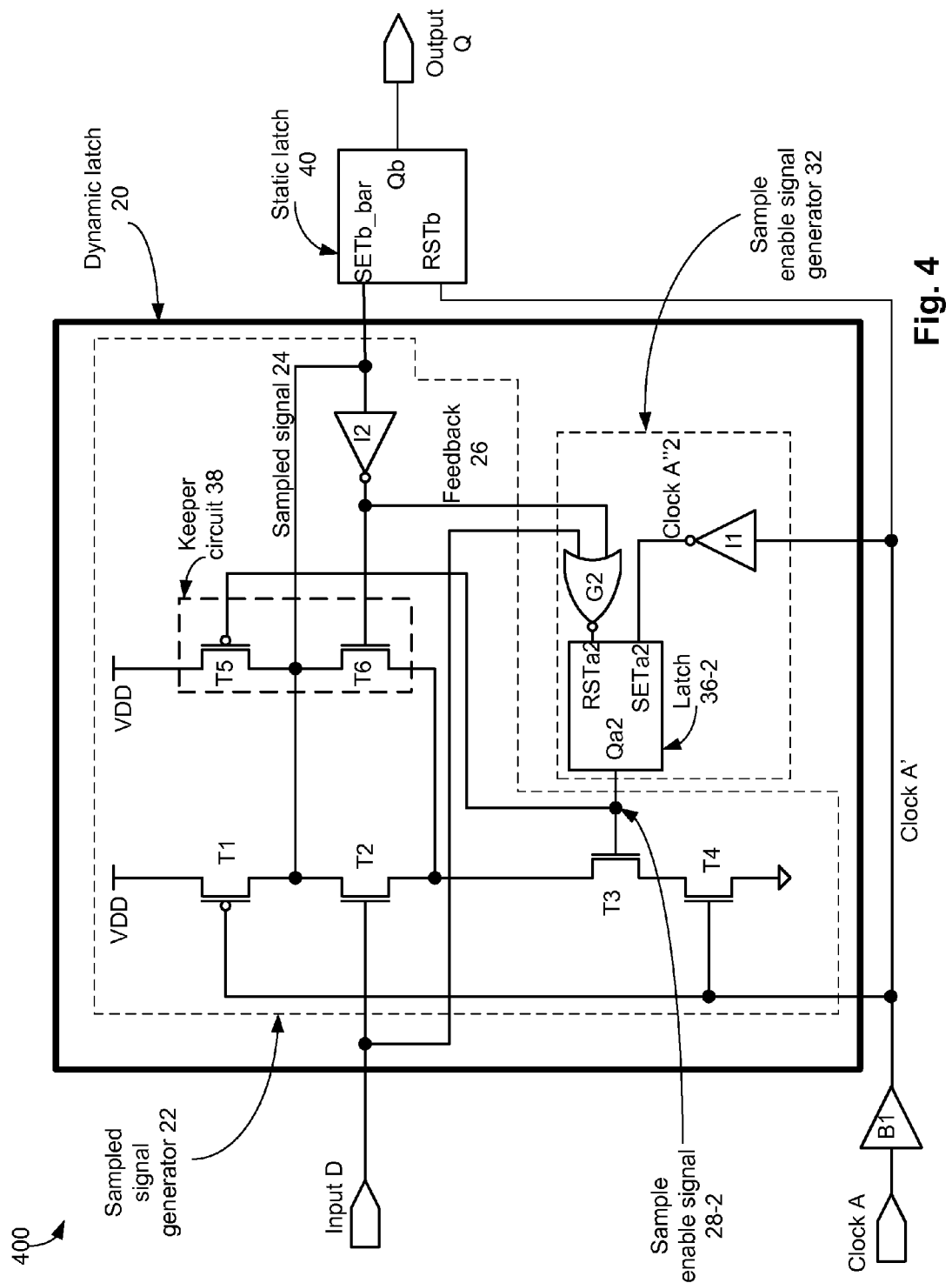
FIG. 4 schematically illustrates another flip-flop, in accordance with an embodiment of the present disclosure.

FIG. 4 schematically illustrates a flip-flop 400, in accordance with an embodiment of the present disclosure. Various components of the flip-flop 400 of FIG. 4 are to an extent similar to the corresponding components of the flip-flop 10 of FIG. 2. Accordingly, some of the components of the flip-flop 400 of FIG. 4 are labeled using similar numerical labels as in the flip-flop 10 of FIG. 2.

However, unlike the NOR gate G1 in the flip-flop 10 of FIG. 2, the flip-flop 400 of FIG. 4 includes a NOR gate G2 that has the input D and the feedback 26 as its input. That is, unlike the NOR gate G1 in the flip-flop 10 of FIG. 2, the NOR gate G2 of FIG. 4 does not have the clock A' as one of its input. Also, the flip-flop 400 includes a latch 36-2, which operates similar to the latch 36 in the flip-flop 10. In an embodiment, the latch 36-2 is a set-dominant latch (SDL). The latch 36-2 of the flip-flop 400 includes terminals RSTa2, SETa2 and Qa2, which are similar to the corresponding terminals of the flip-flop 10. Also, the clock A" and the sample enable signal 28 of FIG. 2 is replaced by clock A"2 and the sample enable signal 28-2, respectively, in FIG. 4.

An operation of the flip-flop 400 is to an extent similar to the operation of the flip-flop 10 of FIG. 2. For example, the operations of the two flip-flops are similar when the input D is at high and/or low logical values in the vicinity of rising edges of the clock A, e.g., as illustrated in FIG. 3. Thus, the timing diagram of FIG. 3 is also valid for the flip-flop 400 of FIG. 4.

Referring to the flip-flop 400 of FIG. 4, when the clock A"2 transitions to a high logical value, the set terminal SETa2 terminal is activated, and the Qa2 terminal goes high (i.e., the sample enable signal 28-2 transitions to a high logical value), irrespective of the logical state of the output of the NOR gate G2. When the input D is at the low logical value in the flip-flop 400, the output of the NOR gate G2 is high and the RSTa2 terminal is activated. Once the RSTa2 terminal is activated, when the clock A"2 next transitions to the low logical value, the latch 36-2 immediately resets and pulls the sample enable signal 28-2 to the low logical value. If however, for example, the input D is activated a sufficient time before the clock A"2 goes low, the latch 36-2 may not reset. Thus, the input D has to be activated sometime before the clock A"2 goes low.

When the clock A" is high and input D is low, RSTa is low in the flip-flop 10 but is high in the flip-flop 400. Thus, when the clock A" goes low, latch 36-2 in the flip-flop 400 immediately resets, while the latch 36 in the flip-flop 10 resets only after a propagation delay through the NOR gate G1. In order to prevent reset, input D has to, therefore, go high earlier in the flip-400 than in the flip-flop 10.

Figure 5A:
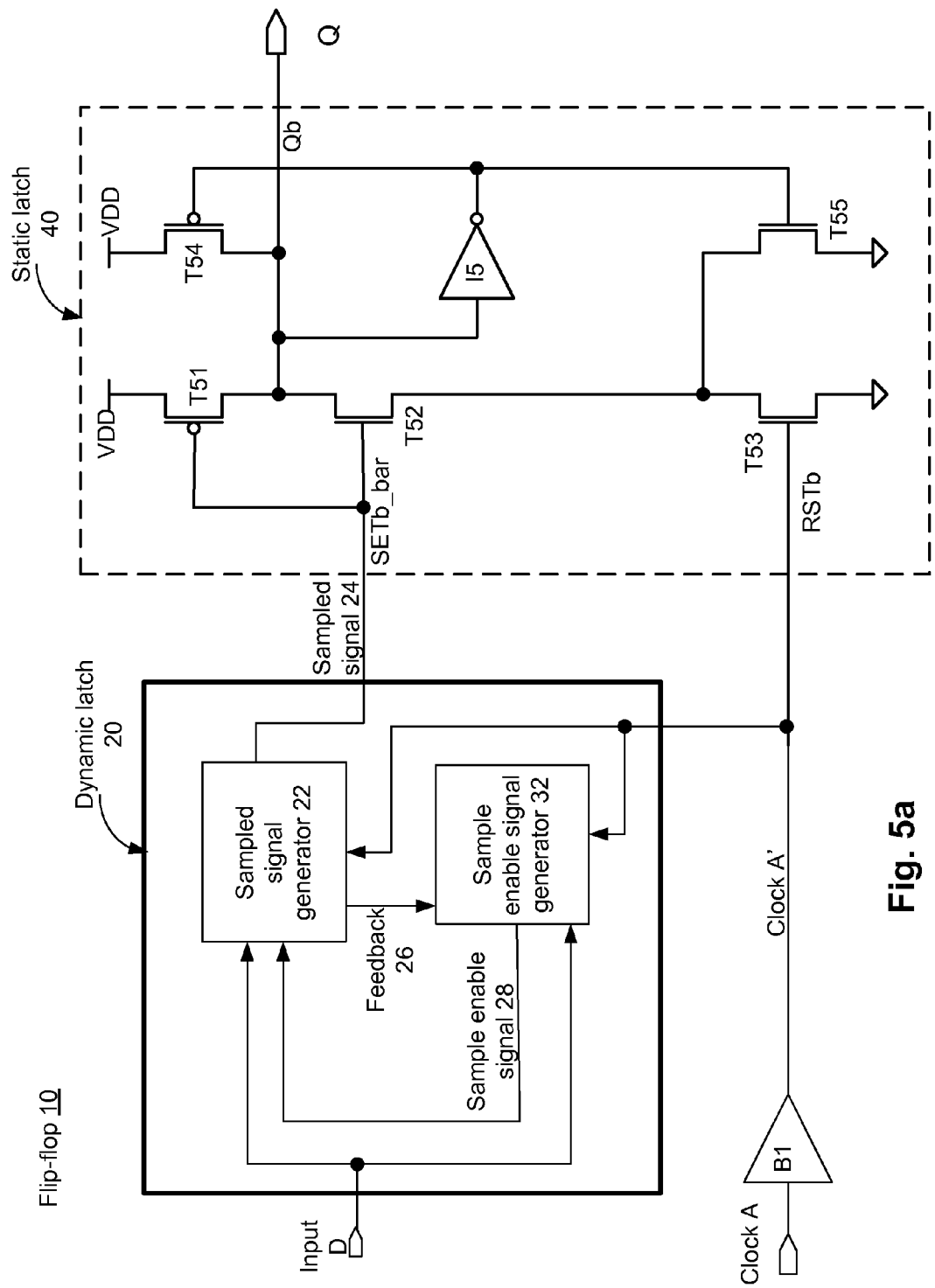
FIGS. 5a and 5b illustrate two examples of a static latch of FIGS. 1, 2 and 4 in more detail, in accordance with an embodiment of the present disclosure.
Figure 5B:
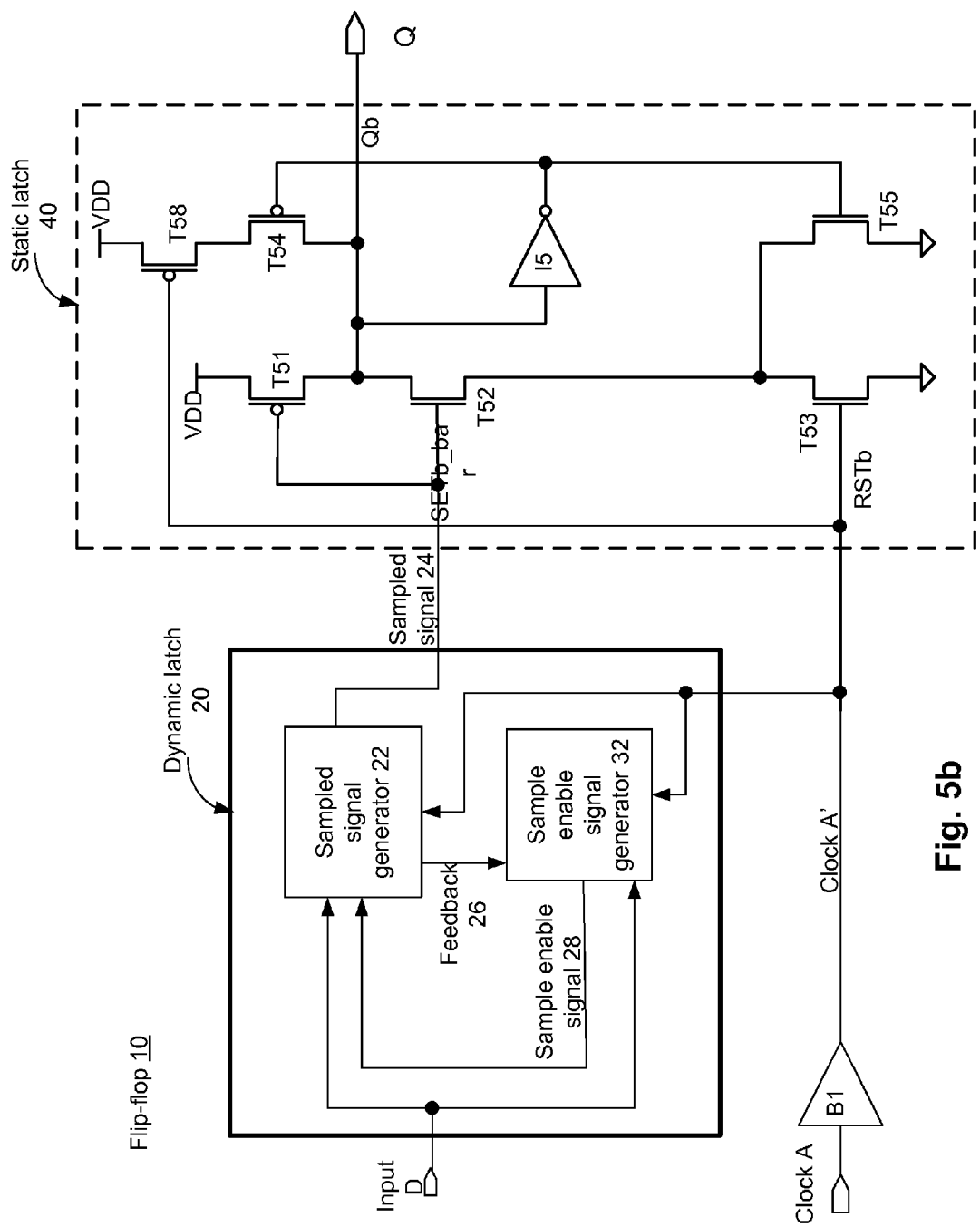

FIGS. 5a and 5b illustrate two examples of the static latch 40 of FIG. 1 (and/or the static latch 40 of FIG. 4) in more detail, in accordance with an embodiment of the present disclosure. Referring to FIG. 5a, the static latch 40 includes transistors T51, T52 and T53 that are coupled in series. The static latch 40 also includes transistors T54 and T55, and an inverter I5, as illustrated in FIG. 5. The transistor T51 is coupled between the power supply $V_{DD}$ and the output terminal Qb, and is controlled by the sampled signal 24. The transistor T52 is coupled between the output terminal Qb and a terminal of the transistor T53, and is also controlled by the sampled signal 24. The transistor T53 is coupled between a terminal of the transistor T52 and a ground terminal, and is controlled by the clock A'. The transistor T54 is coupled between the power supply $V_{DD}$ and the output terminal Qb, and is controlled by an output of the inverter I5. The inverter I5 receives the output Q and generates an output by inverting the output Q. The transistor T55 is coupled between the terminal of the transistor T52 and the ground, and is also controlled by the output of the inverter I5.

Various components of the static latch 40 of FIG. 5b are substantially similar to the corresponding components of FIG. 5a. However, unlike FIG. 5a, the static latch 40 in FIG. 5b includes a transistor T58 that is coupled between the power supply $V_{DD}$ and the transistor T54, where the transistor T58 is controlled by the clock A'. In an embodiment, the transistor T58 prevents contention between (i) the transistor T54 and (ii) the transistors T52 and T53 when, for example, SETb_bar and RSTb are both high. In an embodiment, the latch 40 of FIG. 5b has a relatively more robust operation (e.g., without contention between the transistors) compared to the latch 40 of FIG. 5a.

Figure 6:
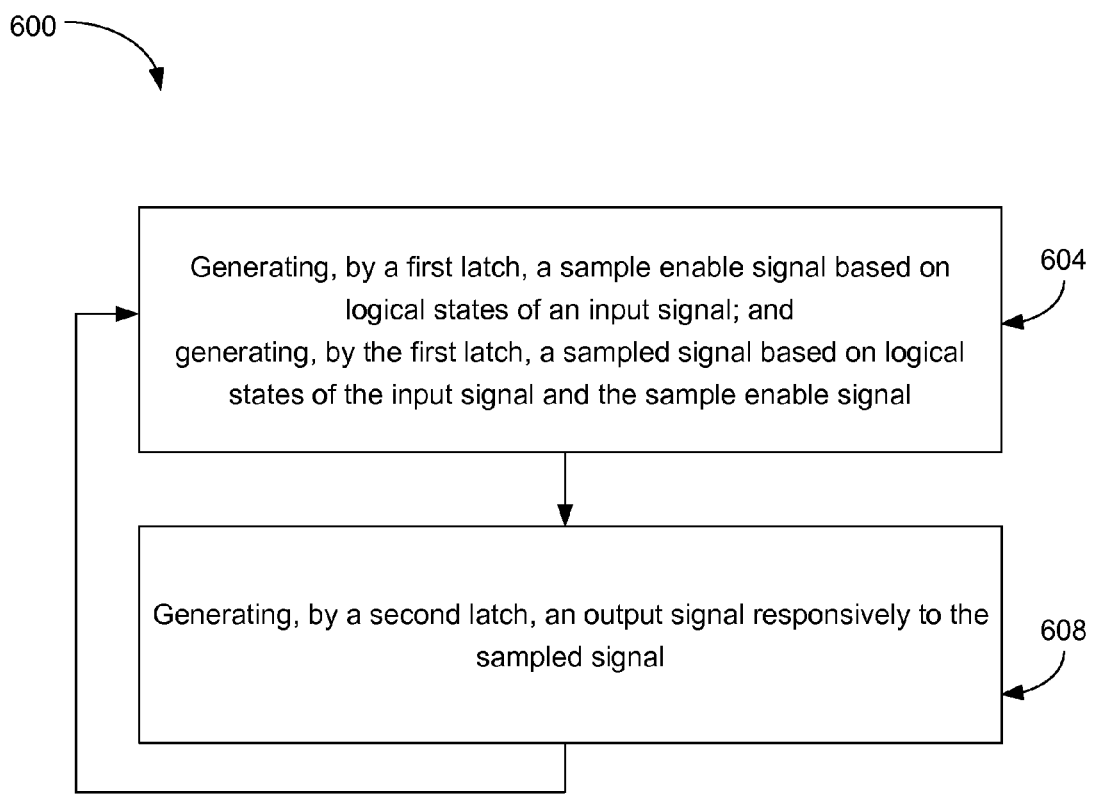
FIG. 6 illustrates an example of a method for operating the flip-flops of FIGS. 1, 2 and 4, in accordance with an embodiment of the present disclosure.

FIG. 6 illustrates an example of a method 600 for operating the flip-flop 10 of FIGS. 1 and 2 (and/or the flip-flop 400 of FIG. 4), in accordance with an embodiment of the present disclosure. At 604, a first latch (e.g., the dynamic latch 20) generates the sample enable 28 signal based on logical states of input D and also generates the sampled signal 24 based on logical states of the input D and the sample enable signal 28. At 608, a second latch (e.g., the static latch 40) generates output Q responsively to the sampled signal 24. The method repeats in a loop (e.g., operations at 604 are repeated after operations at 608).

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A flip-flop, comprising:
   a first circuit comprising:
      a first signal generator configured to (i) receive an input signal and a feedback signal, and (ii) based on logical states of the input signal and the feedback signal, generate a sample enable signal, and
      a second signal generator configured to (i) receive the input signal and the sample enable signal, (ii) based on logical states of the input signal and the sample enable signal, generate a sampled signal and the feedback signal, the feedback signal being different from the sampled signal; and
   a second circuit configured to (i) receive the sampled signal and (ii) generate an output signal responsively to the sampled signal.

2. The flip-flop of claim 1, wherein the feedback signal is an inverse of the sampled signal.

3. The flip-flop of claim 1, wherein the first signal generator is further configured to generate the sample enable signal by:
   generating the sample enable signal such that the sample enable signal is operative to (A) enable the sampled signal to sample the input signal while the input signal is at a high logical value, and (B) prevent the sampled signal from sampling the input signal while the input signal is at a low logical value.

4. The flip-flop of claim 1, wherein the first signal generator is further configured to generate the sample enable signal by:

generating a high logical value of the sample enable signal responsive to a low logical value of a clock signal;

generating a low logical value of the sample enable signal responsive to (i) a high logical value of the clock signal, (ii) a low logical value of the input signal, and (iii) a high logical value of the sampled signal; and preserving a high logical value of the sample enable signal responsive to (i) a high logical value of the clock signal and (ii) one or more of:
(A) a high logical value of the input signal, and
(B) a low logical value of the sampled signal.

5. The flip-flop of claim 1, wherein the first signal generator is further configured to generate the sample enable signal by:
pre-charging the sample enable signal to a high logical value during a low logical value of a clock signal; and
selectively discharging the sample enable signal to a low logical value during a high logical value of the clock signal, based on the input signal being at a low logical value.

6. The flip-flop of claim 1, wherein the second circuit is configured to logically generate the output signal by:
switching the output signal to a high logical value when the sampled signal has a low logical value during a high logical value of a clock signal; and
switching the output signal to a low logical value when the sampled signal has a high logical value during the high logical value of the clock signal.

7. The flip-flop of claim 1, wherein the first circuit further comprises:
a NOR logic gate configured to receive the input signal and the feedback signal; and
a latch configured to (i) receive an output of the NOR logic gate and an inverse of a clock signal, and (ii) generate the sample enable signal.

8. The flip-flop of claim 7, wherein the NOR logic gate is further configured to receive the inverse of the clock signal.

9. The flip-flop of claim 7, wherein the third circuit comprises:
a set terminal configured to receive the inverse of the clock signal; and
a reset terminal configured to receive the output of the NOR logic gate.

10. The flip-flop of claim 7, wherein the first signal generator is further configured to generate the sample enable signal by:
generating a high logical value of the sample enable signal responsive to a low logical value of the clock signal;
generating a low logical value of the sample enable signal responsive to (i) a high logical value of the clock signal and (ii) a high logical value of the output of the NOR logic gate; and
preserve a previous state of the sample enable signal responsive to a (i) a high logical value of the clock signal and (ii) a low logical value of the output of the NOR logic gate.

11. The flip-flop of claim 7, wherein the first circuit further comprises:
a first transistor coupled between a power supply terminal and a second transistor, the first transistor configured to be controlled by the clock signal;
the second transistor coupled between the first transistor and a third transistor, the second transistor configured to be controlled by the input signal, wherein a node between the first transistor and the second transistor outputs the sampled signal;
the third transistor coupled between the second transistor and a fourth transistor, the third transistor configured to be controlled by the sample enable signal; and
the fourth transistor coupled between the third transistor and a ground terminal, the fourth transistor configured to be controlled by the clock signal.

12. The flip-flop of claim 11, wherein the first circuit further comprises:
a keeper circuit comprising:
a fifth transistor coupled between another power supply terminal and a sixth transistor, the fifth transistor configured to be controlled by the sample enable signal; and
the sixth transistor coupled between the fifth transistor and the third transistor, the sixth transistor configured to be controlled by an inverse of the sampled signal, wherein the node that outputs the sampled signal is coupled between the fifth transistor and the sixth transistor.

13. The flip-flop of claim 1, wherein the second signal generator is configured to generate the sampled signal by:
pre-charging the sampled signal to a high logical value during a low logical value of a clock signal; and
selectively discharging the sampled signal to a low logical value during a high logical value of the clock signal, based on the input signal being sampled at a high logical value.

14. The flip-flop of claim 1, wherein the first circuit is a dynamic latch and wherein the second circuit is a static latch.

15. An integrated circuit comprising the flip flop of claim 1.

16. A method comprising:
receiving, at (i) a first signal generator of a first circuit and (ii) a second signal generator of the first circuit, an input signal;
receiving, at the first signal generator, a feedback signal;
generating, at the first signal generator, a sample enable signal based on logical states of the input signal and the feedback signal;
based on logical states of the input signal and the sample enable signal, outputting, from the second signal generator, a sampled signal and the feedback signal, the sampled signal being different from the feedback signal; and
generating, by a second circuit, an output signal responsively to the sampled signal.

17. The method of claim 16, wherein generating the sample enable signal further comprises:
generating the sample enable signal such that the sample enable signal is operative to (A) enable sampling the input signal while the input signal is at a high logical value, and (B) prevent sampling the input signal while the input signal is at a low logical value.

18. The method of claim 16, wherein generating the sample enable signal further comprises:
generating a high logical value of the sample enable signal responsive to a low logical value of a clock signal;
generating a low logical value of the sample enable signal responsive to (i) a high logical value of the clock signal, (ii) a low logical value of the input signal, and (iii) a high logical value of the sampled signal; and
preserving a high logical level of the sample enable signal responsive to (i) a high logical value of the clock signal and (ii) one or more of:
(A) a high logical value of the input signal, and
(B) a low logical value of the sampled signal.

19. The method of claim 16, wherein outputting, from the second signal generator, the feedback signal comprises:

outputting the feedback signal such that the feedback signal is an inverse of the sampled signal.

20. The method of claim 16, wherein generating the output signal further comprises:
- switching the output signal to a high logical value when the sampled signal has a low logical value during a high logical value of a clock signal; and
- switching the output signal to a low logical value when the sampled signal has a high logical value during the high logical value of the clock signal.

* * * * *